United States Patent [19]
Rountre

[11] Patent Number: 5,012,317
[45] Date of Patent: Apr. 30, 1991

[54] ELECTROSTATIC DISCHARGE PROTECTION CIRCUIT

[75] Inventor: Robert N. Rountre, Plano, Tex.

[73] Assignee: Texas Instruments Incorporated, Dallas, Tex.

[21] Appl. No.: 213,499

[22] Filed: Jun. 27, 1988

Related U.S. Application Data

[63] Continuation of Ser. No. 27,103, Mar. 13, 1987, abandoned, which is a continuation of Ser. No. 851,179, Apr. 14, 1986, abandoned.

[51] Int. Cl.$^5$ .................. H01L 29/740; H01L 29/900; H01L 27/20; H02H 9/00
[52] U.S. Cl. ........................................ 357/38; 357/13; 357/43; 357/51; 361/56
[58] Field of Search .................. 357/23.13, 13, 38, 51, 357/86; 361/56, 90, 91

[56] References Cited

U.S. PATENT DOCUMENTS

| | | | |
|---|---|---|---|
| 2,655,610 | 10/1953 | Ebers | 357/38 |
| 4,117,507 | 9/1978 | Pacor | 357/86 |
| 4,282,555 | 8/1987 | Suedberg | 357/13 |
| 4,400,711 | 8/1983 | Avery | 357/43 |
| 4,484,244 | 11/1984 | Avery | 361/56 |
| 4,605,872 | 8/1986 | Rung | 307/465 |
| 4,626,882 | 12/1986 | Cottrell et al. | 357/23.13 |

FOREIGN PATENT DOCUMENTS 2336287 2/1975 Fed. Rep. of Germany .... 357/38 C

OTHER PUBLICATIONS

Using SLR's as Transient Protection Structure in Integrated Circuits L. R. Avery RCA DSRC EOS/ESD Symposium Proceedings, 1983, pp. 177–180.

Rountree et al., "A Process-Tolerant Input Protection Circuit for Advanced CMOS Processes," 1988 EOS/ESD Symposium.

*Primary Examiner*—Rolf Hille
*Assistant Examiner*—Peter Toby Brown
*Attorney, Agent, or Firm*—James C. Kesterson; James T. Comfort; Melvin Sharp

[57] ABSTRACT

An ESD protection device includes a PNPN type device disposed between the input pad (12) and ground. A first P-layer (48) is disposed in an N-type well (46) which is formed in a P-type layer (44). A second N-region (52) is provided for connection to ground. This provides an SCR which can be turned on by avalanching the intermediate PN junction (32) to place the device in a regenerative mode for positive transients. For negative transients, a P+ region (54) is provided in P-layer (44) to bypass a PN junction (34) and a N+ region (50) is defined in the N-type region (46) to bypass PN junction (30). This provides a forward-biased diode for the negative transient.

9 Claims, 1 Drawing Sheet

ELECTROSTATIC DISCHARGE PROTECTION CIRCUIT

This application is a continuation of application Ser. No. 027,103, filed 3/13/87, which is a continuation of application Ser. No. 851,179, filed 4/14/86, both now abandoned.

TECHNICAL FIELD OF THE INVENTION

The present invention pertains in general to protection circuitry and, more particularly, to circuitry for providing protection against high-voltage transients due to electrostatic discharge.

BACKGROUND OF THE INVENTION

Electrostatic discharge (ESD) has proven in recent years to play a significant problem in failures of a large number of integrated circuits. This is especially true with circuits utilizing metal-oxide technology. Electrostatic discharges result from an external source discharging large transient voltages for a short duration of time onto an input terminal of the device. Devices fabricated with present technology, such as metal oxide silicon (MOS), have only a very small amount of series resistance between the input pad and the actual active circuitry on the device. This lack of series resistance on the input to the active circuitry allows large voltage transients to pass therethough with resulting large currents for a short duration of time. These large currents can cause catastrophic failure in the device and this failure mode has recently received a great deal of attention.

Present ESD protection circuits systems utilize shunting devices on the input pad to bypass the active circuitry. One example of these is disclosed in U.S. Pat. Nos. 4,400,711 and 4,484,244, issued to Leslie R. Avery and L. R. Avery, "Using SCR's as Transient Protection Structures in Integrated Circuits" EOS/ESD Symposium Proceedings, 1983, pp. 177-180. The Avery device is a bipolar device and is comprised of two SCR's, one for protection from positive transients and one for protection from negative transients. However, the structure illustrated in the Avery patents is not compatible with technologies such as MOS, since it requires a large number of diffused regions.

SUMMARY OF THE INVENTION

The present invention disclosed herein comprises an electrostatic discharge protection circuit. The protection circuit is comprised of a first region of P-type material disposed adjacent a second region of N-type material, the first region of P-type material interfaced with an input terminal. The first and second regions form a first PN junction. The second region of semiconductor material is disposed adjacent a third P-type material to form a second and intermediate PN junction that is oriented opposite to the first PN junction. A fourth N-type region is provided and disposed adjacent the third P-type region to provide a third PN junction oriented in the direction of the first PN junction. The fourth N-type region is interfaced with ground. A resistance is disposed between the input terminal and the second N-type region and a second resistance is disposed between the third P-type region and ground. A voltage that exceeds the avalanche voltage of the intermediate PN junction turns on the device and places it in a regenerative mode. A reverse voltage forward biases the intermediate PN junction through the first and second resistors.

BRIEF DESCRIPTION OF THE DRAWINGS:

For a more complete understanding of the present invention and the advantages thereof, reference is now made in the following description taken in conjunction with the accompanying Drawings in which.

DETAILED DESCRIPTION OF THE INVENTION

Figure 1:
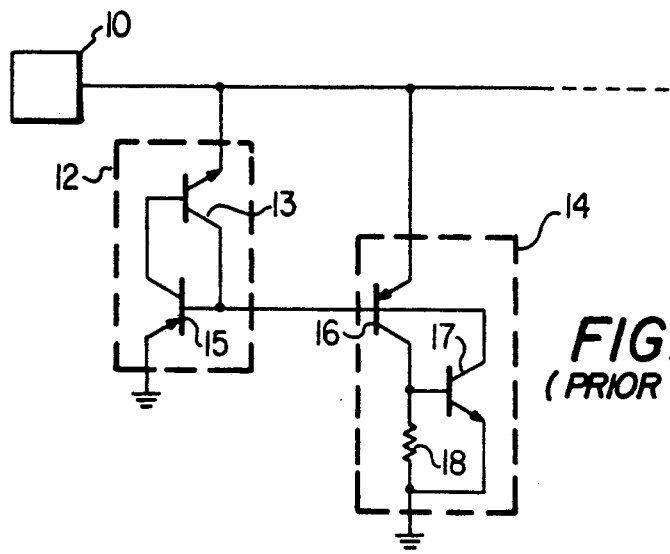
FIG. 1 illustrates a circuit diagram of a prior art system for protection of an active circuit from electrostatic discharge.

Referring now to FIG. 1, there is illustrated a schematic of a prior art system which was disclosed in U.S. Pat. No. 4,484,244, issued to L. R. Avery, on Nov. 20, 1984. The prior art circuit of FIG. 1 utilizes a negative transient protection circuit 12 connected between a pad 10 and ground, and a positve transient protection circuit 14 connected between pad 10 and ground. The negative protection circuit 12 is comprised of an SCR which is modeled as a NPN transistor 13 and a PNP transistor 15. The NPN transistor 13 has the emitter thereof connected to the pad 10, the base thereof connected to the collector of transistor 15 and the collector thereof connected to the base of transistor 15, with transistor 15 having the emitter thereof connected to ground. In a similar manner, the positive transient protection circuit 14 is comprised of a PNP transistor 16 and an NPN transistor 17 configured as an SCR. Transistor 16 has the emitter thereof connected to pad 10, the base thereof connected to the base of transistor 15 in the transient protection circuit 12 and the collector thereof connected to the base of transistor 17. The base of transistor 16 is also connected to the collector of transistor 17 with transistor 17 having the emitter thereof connected to ground. A resistor 18 is provided between the base of transistor 17 and ground.

In operation, the transient protection circuits 12 and 14 operate in a first non-regenerative mode to block current and a second and regenerative mode which passes current. To go from the non-regenerative to the regenerative mode, it is necessary to "avalanche" the intermediate PN junction in either of the devices. This PN junction consists of the collector-base of both the PNP and the NPN devices which make up the SCR. Once this intermediate PN junction is avalanched, it turns on the SCR and causes it to go into the regenerative mode and pass current. There is a holding voltage which must be exceeded to maintain the device on. When the voltage falls below this holding voltage, the device returns to the blocking or non-regenerative state.

Figure 2A:
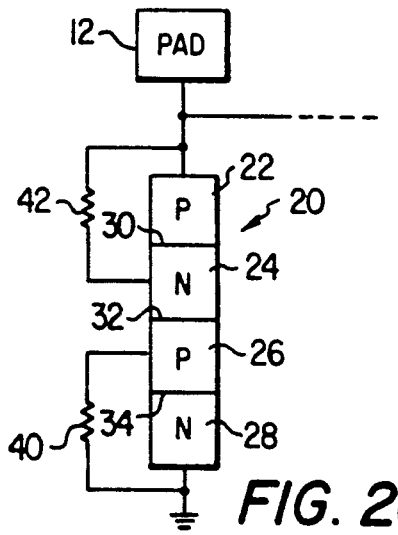
FIGS. 2a and 2b illustrate the structure of the circuit of the present invention.

Referring now to FIG. 2a, there is illustrated a schematic diagram of the circuit of the present invention which is connected between the pad 12 and ground. The protection circuit of the present invention is shown conceptually as a four-layer semiconductor device 20 having a first layer 22 of P-type material disposed adjacent a layer 24 of N-type material. Layer 24 is disposed adjacent a layer 26 of P-type material and layer 26 is disposed adjacent layer 28 of N-type material. The P-type layer 22 is connected on one side thereof to the pad 12 and the N-type layer 28 is connected to ground. The P-type layer 22 and the N-type layer 24 form a PN junction 30 therebetween with the N-type layer 24 and the P-type layer 26 forming an intermediate P-N junction 32. The P-type layer 26 and the N-type layer 28 form a PN junction 34. The device 20 is essentially configured as a silicon control rectifier (SCR) with the PNPN type device.

Figure 2B:
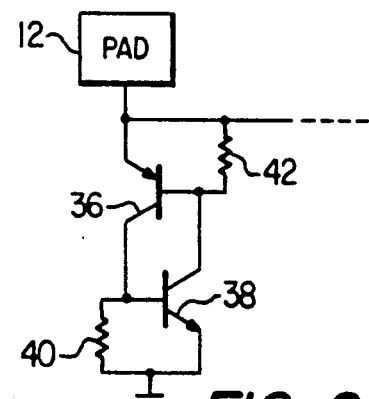

Referring now to FIG. 2b, there is illustrated a schematic diagram of a two transistor analogy for the PNPN device of FIG. 2a. The two transistor analogy is shown as a PNP transistor 36 and NPN transistor 38. The PNP transistor 36 has the emitter thereof connected to the pad 12, the base thereof connected to the collector of NPN transistor 38 and the collector thereof connected to the base of NPN transistor 38. NPN transistor 38 has the emitter thereof connected to ground. The PN junction 30 comprises the emitter-base junction of PNP transistor 36 and the PN junction 34 comprises the emitter-base junction of transistor 38. The PN junction 32 comprises the collector-base junction of both NPN transistor 38 and PNP transistor 36.

In the normal operation of an SCR, there is an off-state or non-regenerative state and an on-state or regenerative. In the off-state, current is blocked and, in the on-state, the SCR is in a regenerative mode and remains there until the voltage on the anode of the SCR is lowered beneath a "holding" voltage.

With further reference to FIG. 2a, the gate of the SCR is normally connected to the base of transistor 38. When a positive pulse is applied to the base of the NPN transistor 38, the transistor turns on and forces the collector (which is also the base of the PNP transistor 36) to a low potential. As a result, a current begins to flow through the collector-emitter of NPN transistor 38. Because the PNP transistor 36 is then in the active state, its collector current flows into the base of the NPN transistor 38, i.e. the collector current of PNP transistor 36 equals the base current of NPN transistor 38. This sets up the condition for regeneration. If the external gate drive is removed, the model remains in the on-state as a result of the division of currents associated with the two transistors, provided that sufficient principal current through the collector-emitter of NPN transistor 38 is available.

Theoretically, the two transistor model illustrated in FIG. 2b remains in the on-state until the principal current flow through the emitter-collector of NPN transistor 38 is reduced to zero. Actually, turn-off occurs at some value of current greater than zero. This effect can be explained by observation of the division of currents as the voltage on the base of the PNP transistor 36 is reduced. As the principal current is gradually reduced to the zero current level as a result of lowering of the voltage on pad 12, the division of currents within the model can no longer sustain the required regeneration, and the model reverts to the blocking state.

The two transistor model illustrates three features of the SCR: (1) A gate trigger current is required to initiate regeneration across the PN junction 32, (2) a minimum principal current (referred to as "latching current") must be available to sustain regeneration, and (3) reduction of principal-current flow results in turn-off at some level of current flow (referred to as "holding current") that is slightly greater than zero.

A resistor 40 is shown connected between the P-layer 26 (which constitutes the base of the NPN transistor 38) and ground resistor 40 requires the collector-emitter current of PNP transistor 36 to be increased to supply current through resistor 40 and also through the base-emitter of NPN transistor 38. Because the principal current flow must be increased to supply this increased collector current, latching and holding current requirements also increase. Additionally, a resistor 42 is disposed between the N-layer 24 and the pad 12 which corresponds to the connection between the base of PNP transistor 36 and the pad 12. Resistor 42 effectively reduces the gain of PNP transistor 36, which is the same as utilizing a lower beta PNP transistor. Resistors 40 and 42 provide immunity from "false" turn-on.

In operation, there are two types of transients that are of concern, a positive transient and a negative transient. For the positive transient, current is caused to flow through the PN junction 30 but is blocked by the reverse biased PN junction 32. In normal SCR operation, gate current can be provided to the P-layer 26 to turn on the SCR. In the present case, no external gate supply is provided. To turn on the SCR on, a voltage that exceeds the "avalanche" level of the PN junction 32 is required. When PN junction 32 is avalanched, this allows current to be provided to PN junction 34, thus causing additional current to be pulsed through PN junction 30 and turn on the SCR. Once the SCR is turned on, it is in a regenerative mode and is maintained on. The holding voltage for the SCR is adjusted such that it is slightly above the operating voltage. For example, a device in which the active circuit operates on 5 volts might have the holding voltage set at 8 volts. Therefore, when the transient fell below 8 volts, the SCR would be turned off or become non-regenerative.

In another mode of turn-on, a fast rising pulse could cause the N-side of PN junction 32 to be pulled high and would also cause the P-side of PN junction 32 to be pulled high due to the capacitance of that junction. This would in turn cause the PN junction 34 to become forward-biased, thus turning on the PNP transistor, thus resulting in turn-on of the protective device.

In the negative transient mode, PN junction 32 is forward-biased through resistor 42 and through resistor 40. Resistors 40 and 42 effectively remove reverse-biased PN junction 34 and reverse-biased PN junction 30, respectively, from the current flow path. This effectively places a diode between the pad and the ground which conducts current when the negative voltage exceeds the forward-bias threshold of the PN junction. In the positive transient case, the resistors 40 and 42, described above, provide desensitization of the circuit. However, if the resistors 40 and 42 were not utilized in the positive transient condition, the device would still turn-on but would be much more sensitive.

Figure 3:
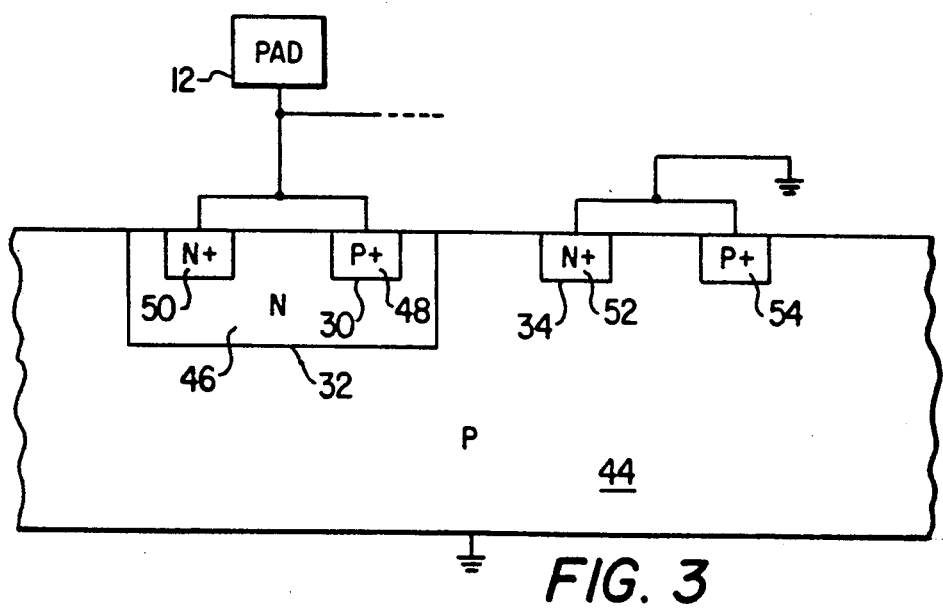
FIG. 3 illustrates a structural cross-section of the protection circuit of the present invention.

Referring now to FIG. 3, there is illustrated a cross-sectional diagram of the protection circuit of the present invention. A P-type semiconductor layer 44 is provided which is lightly doped. An N-type well 46 is defined in the P-type layer 44 by a diffusion process to provide a lightly doped N-type semiconductor region. This forms the PN junction 32 with the N-type well 46 corresponding to the N-layer 24 in FIG. 2a. A P+ region 48 is diffused into the N-type well 46 and corresponds to the P-layer 22. The PN junction between P+ region 48 and N-type well 46 provides the PN junction 30. The P+ region 48 is connected to the pad 12.

An N+ region 50 of heavily doped N-type material is defined in the N-type well 46 and connects to the resistance 42. The N+ region 50 is connected to the pad 12 to provide a resistive connection between pad 12 and the N-type well 46 to allow reverse conduction through the PN junction 32 when negative transients are present, as described above.

A heavily doped N-type region 52 is provided in the P-type layer 44 outside of the N-type well 46 and corresponds to the N-type layer 28 in FIG. 2a. The junction between the N+ region 52 and P-type layer 44 provides the PN junction 34. A heavily doped P-type region 54 is provided in the P-type layer 44 outside of the N-type well 46 to provide a P+ low resistivity region. The P+ region 54 connects to the resistance 40 provided by the P-type layer 44. The N+ region 52 and the P+ region 54 are connected to the $V_{ss}$ or ground.

In operation, the positive transient causes current to flow through P+ region 48 to avalanche the PN junction 32 between N-type well 46 and the P-type layer 44. The current then flows from the P-type layer 44 to the N+ region 52 across the PN junction 34 to ground. In the reverse transient mode, current flows from ground through the P+ region 54 to P-type layer 44. In this mode, current flows from P-type layer 44 through PN junction 32 to N-type well 46 and through N+ region 50 to pad 12.

In summary, there has been provided an ESD protection device which utilizes a PNPN device in series with the input pad and ground. This provides an SCR device which is turned on with a positive transient by avalanching the center PN junction, thus placing the device in a regenerative mode. For the reverse transient condition, a resistor is provided for connecting one side of the intermediate junction of the SCR device to ground and a second resistor is provided between the other side of the intermediate PN junction to the input pad. This allows the PNPN device to function as a diode by bypassing the two input and output PN junctions.

Although the preferred embodiment has been described in detail, it should be understood that various changes, substitutions and alterations can be made herein without departing from the spirit and scope of the invention as defined by the appended claims.

What is claimed is:

1. An electrostatic discharge protection device formed at a face of a semiconductor body, for conducting electrostatic discharge current from a terminal to a reference potential, comprising:
   a first region of semiconductor material of a first conductivity type formed at said face of said semiconductor body, and in conductive interface with said terminal;
   a second region of semiconductor material of a second conductivity type within which said first region is disposed;
   a third region of semiconductor material of the first conductivity type disposed adjacent said second region;
   a fourth region of semiconductor material of the second conductivity type disposed within said third region, said fourth region formed at said face of said semiconductor body, and in conductive interface with said reference potential; and
   a first ohmic connection between said terminal and said second region;
   wherein, responsive to a voltage applied to said terminal of a polarity relative to said reference potential so as to forward bias the junction between said first and second regions, and of sufficient magnitude to break down the junction between said second and third regions, current is conducted between said terminal and said reference potential substantially in a direction parallel to said face through said third region.

2. The electrostatic discharge protection device of claim 1 wherein said first conductivity type is P-type and said second conductivity type is N-type.

3. The electrostatic discharge protection device of claim 1 wherein said first, second, third and fourth regions form a silicon controlled rectifier capable of operating in a first and non-regenerative mode to block current in the first direction and in a second and regenerative mode to pass current in the first direction from said terminal to said reference potential, said silicon controlled rectifier switching from said first mode to said second mode when a voltage is applied across said terminal at a level higher than a predetermined level above the reference potential.

4. The electrostatic discharge protection device of claim 1 wherein said first ohmic connection comprises a fifth region of semiconductor material of the second conductivity type disposed within said second region, said fifth region formed at said face of said semiconductor body and in conductive interface with said terminal.

5. The electrostatic discharge protection device of claim 4 wherein said fifth region is heavily doped with the second conductivity type.

6. The electrostatic discharge device of claim 4 wherein:
   said second region is comprised of semiconductor material of the second conductivity type disposed within said third region.

7. The electrostatic discharge protection device of claim 1 wherein said first and fourth regions are heavily doped with said first and second conductivity type dopants, respectively.

8. The electrostatic discharge protection device of claim 1, further comprising a second ohmic connection between said third region and said reference potential.

9. The electrostatic discharge protection device of claim 4, further comprising a sixth region of semiconductor material of the second conductivity type disposed within said third region, said sixth region formed at said face of said semiconductor body and in conductive interface with said reference potential.

* * * * *